United States Patent
Cheng et al.

(10) Patent No.: US 12,398,463 B1
(45) Date of Patent: Aug. 26, 2025

(54) ORGANIC SMALL MOLECULE INHIBITORS AND APPLICATION METHOD THEREOF IN THIN FILM DEPOSITION

(71) Applicant: HEFEI ADCHEM SEMI-TECH. CO., LTD., Hefei (CN)

(72) Inventors: Lanyun Cheng, Hefei (CN); Xueqi Zhang, Hefei (CN); Jing Hu, Hefei (CN); Jianheng Li, Hefei (CN); Sikun Zhu, Hefei (CN)

(73) Assignee: HEFEI ADCHEM SEMI-TECH. CO., LTD., Anhui (CN)

( * ) Notice: Subject to any disclaimer, the term of this patent is extended or adjusted under 35 U.S.C. 154(b) by 0 days.

(21) Appl. No.: 19/176,128

(22) Filed: Apr. 10, 2025

Related U.S. Application Data

(63) Continuation of application No. PCT/CN2024/093245, filed on May 15, 2024.

Foreign Application Priority Data

Apr. 8, 2024 (CN) .......................... 202410415912.9

(51) Int. Cl.
*C23C 16/455* (2006.01)
(52) U.S. Cl.
CPC ............................. *C23C 16/45553* (2013.01)
(58) Field of Classification Search
CPC .............................................. C23C 16/45553
See application file for complete search history.

(56) References Cited

U.S. PATENT DOCUMENTS

2012/0128867 A1*  5/2012  Paulson ................ C23C 16/403
                                                              427/78
2018/0342391 A1* 11/2018  Park .................. H01L 21/02178

FOREIGN PATENT DOCUMENTS

| CN | 1616574 A | 5/2005 |
| CN | 103221574 A | 7/2013 |
| CN | 108930028 A | 12/2018 |

OTHER PUBLICATIONS

International Search Report (PCT/CN2024/093245 ) ; Date of Mailing: Dec. 28, 2024.

* cited by examiner

*Primary Examiner* — Michael G Miller
(74) *Attorney, Agent, or Firm* — Vanguard IP LLC

(57) ABSTRACT

The present application discloses organic small molecule inhibitors and an application method thereof in thin film deposition, belonging to the field of semiconductor processing technology. The inhibitors comprise urea compounds, amino acid compounds, and amidine compounds. The application method is as follows: placing a HAR substrate into the atomic layer deposition equipment, loading organic small molecule inhibitors in a stainless-steel source bottle and introducing them into a reaction chamber in pulse form, loading a precursor in the stainless-steel source bottle, using inert gas as a carrier gas, and introducing the precursor into the reaction chamber in pulse form; introducing an oxygen source into the reaction chamber in pulse form to generate an oxide film; introducing inert gas into the reaction chamber to purge excess oxygen source and reaction by-products, repeating the above steps until a preset thickness is reached.

2 Claims, No Drawings

ORGANIC SMALL MOLECULE INHIBITORS AND APPLICATION METHOD THEREOF IN THIN FILM DEPOSITION

TECHNICAL FIELD

The present application belongs to the field of semiconductor processing technology, specifically relating to organic small molecule inhibitors and application method thereof in thin film deposition.

BACKGROUND

To continuously improve device miniaturization and performance optimization, the semiconductor industry has imposed increasingly higher requirements on the storage density of devices. Atomic layer deposition (ALD) is an excellent coating method that has become a crucial front-end process in semiconductor device manufacturing due to its significant advantages of isotropic growth and precisely controllable film thickness.

In high aspect ratio (HAR) 3D nanostructures, such as holes or trenches, ALD deposition often forms seams or voids during the top-down gap filling process, leading to reduced device performance, electrical or thermal conductivity, and mechanical properties. To solve this problem, many researchers have introduced inhibitors in the ALD deposition process, which selectively inhibit deposition at the top of the HAR substrate while allowing the bottom to experience little or no inhibition, thereby enhancing the uniformity of top-down filling, improving step coverage, and eliminating seams or voids.

Patents CN104928654B and CN112400225A introduce plasma inhibitors ($N_2$, Ar, He, $H_2$, $NH_3$, fluorides, amines, alcohols, etc.) to create passivated surfaces, enhancing the nucleation barrier for ALD film formation. When plasma inhibitors interact with the substrate, due to geometric shielding effects, the bottom receives much less plasma treatment compared to the top, thereby improving the step coverage of thin film growth. However, plasma can damage the substrate and is not suitable for application in HAR substrates with higher aspect ratios.

Patents CN113818009A and US20230227972A1 use ALD precursors as inhibitors, where the inhibitor layer exhibits a density gradient that decreases from top to bottom in HAR substrates. For example, in the ALD process of depositing $TiO_2$ thin films using tetrakis(dimethylamino)titanium (TDMAT) and $H_2O$, the introduction of the inhibitor $Cp*Ti(OMe)_3$ improves step coverage, where $Cp*$ represents pentamethylcyclopentadienyl. This is because the inhibitor $Cp*Ti(OMe)_3$ firmly adsorbs to the substrate by eliminating —OMe. Due to the steric hindrance of the $Cp*$ ligand and its weak reactivity with $H_2O$, the $Cp*Ti(OMe)x$ ($1 \leq X \leq 2$) on the substrate surface is difficult to be oxidized by $H_2O$, making it challenging to form new Ti—O bonds, thus inhibiting the growth of $TiO_2$ thin films. In addition, Chi Thang Nguyen[1] et al. conducted a detailed investigation into the inhibition mechanism of the inhibitor $Cp*Ti(OMe)_3$.

Patent US20220119939A1 proposed organic small molecule inhibitors, using triethylamine (TEA), tetrahydrofuran (THF), and ethylene glycol dimethyl ether (DME) as examples. The inhibitor molecules gently physically adsorb onto the HAR substrate, competing with precursor molecules for active sites on the substrate surface, thereby inhibiting excessive adsorption of precursors at the top of the substrate and improving step coverage, although the effectiveness still needs improvement.

Based on existing research, compared to plasma gas inhibitors and ALD precursor-type inhibitors, organic small molecule inhibitors are inexpensive and readily available, more environmentally friendly, and their deposition process parameters are easier to control. Therefore, finding more effective organic small molecule inhibitors is a meaningful research endeavor.

SUMMARY

The purpose of the present application is to provide organic small molecule inhibitors and application method thereof in thin film deposition, solving the problem of poor performance of existing small molecule inhibitors used in ALD deposition.

The purpose of the present application can be achieved through the following technical solutions:

The present application provides organic small molecule inhibitors, comprising urea compounds, amino acid compounds and amidine compounds.

The urea compounds have the structure shown in formula I:

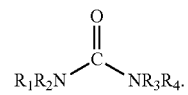

Formula I

In Formula I, R1, R2, R3, R4 are each independently selected from the group consisting of:

any group substituted with hydrogen, halogen, heteroatoms; any group substituted with heteroatoms comprising optionally substituted aliphatic, optionally substituted cycloaliphatic or heterocycloaliphatic, optionally substituted aromatic, typically C1-C10 alkyl, heteroalkyl, alkenyl, heteroalkenyl, alkynyl, heteroalkynyl, haloalkyl, haloalkenyl, haloalkynyl, haloheterocyclyl.

Preferably, the urea compound is one of urea, hydroxyethyl urea, and aminourea.

The amino acid compounds have the structure shown in formula II:

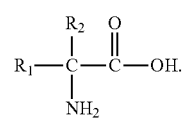

Formula II

In formula II, R1 and R2 are each independently selected from the group consisting of:

any group substituted with hydrogen, halogen, heteroatoms; any group substituted with heteroatoms comprising optionally substituted aliphatic, optionally substituted cycloaliphatic or heterocycloaliphatic, optionally substituted aromatic, typically C1-C10 alkyl, heteroalkyl, alkenyl, heteroalkenyl, alkynyl, heteroalkynyl, haloalkyl, haloalkenyl, haloalkynyl, haloheterocyclyl.

Preferably, the amino acid compound is one of glycine, alanine, and isoleucine.

The amidine compounds have the structure shown in formula III:

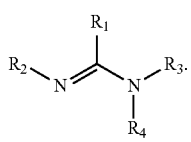

Formula III

In formula III, R1, R2, R3, and R4 are each independently selected from the group consisting of:
any group substituted with hydrogen, halogen, heteroatoms; any group substituted with heteroatoms comprising optionally substituted aliphatic, optionally substituted cycloaliphatic or heterocycloaliphatic, optionally substituted aromatic, typically C1-C10 alkyl, heteroalkyl, alkenyl, heteroalkenyl, alkynyl, heteroalkynyl, haloalkyl, haloalkenyl, haloalkynyl, haloheterocyclyl.

Preferably, the amidine compound is formamidine compound, acetamidine compound, or propionamidine compound. For example, one of N,N'-diisopropyl-formamidine, N,N'-diisopropyl-acetamidine, N,N'-diisopropyl-propionamidine, N-hydroxyacetamidine, formamidine, acetamidine, and propionamidine.

Preferably, the halogen is one or more selected from F, Cl, Br, and I.

Preferably, the heteroatom is one or more selected from O, N, S, P, B, Si.

Preferably, an application of the above organic small molecule inhibitors in thin film deposition on HAR substrates with high aspect ratios.

The present application also provides an application method of the above organic small molecule inhibitors in thin film deposition, comprising the following steps:

S1. placing the HAR substrate into an atomic layer deposition equipment, with chamber temperature of 100-450° C., and evacuating to 0-30 Pa;

S2. loading the organic small molecule inhibitors into a stainless-steel source bottle, connecting the source bottle to a reaction chamber of the atomic layer deposition equipment through a pipeline, heating the source bottle to a temperature of 30-100° C., heating the pipeline to a temperature of 50-150° C., using inert gas as a carrier gas, introducing the organic small molecule inhibitors into the reaction chamber in pulse form, allowing the organic small molecule inhibitors to form H-bonds with the active groups on the substrate surface;

S3. introducing inert gas into the reaction chamber to purge excess organic small molecule inhibitors, with a purge time of 5-50 s;

S4. placing a precursor in the stainless-steel source bottle, connecting the source bottle to the reaction chamber through a pipeline, heating the source bottle to a temperature of 30-100° C., heating the pipeline to a temperature of 50-150° C., using inert gas as a carrier gas, and introducing the precursor into the reaction chamber in pulse form, where the precursor will chemically adsorb to the active groups on the substrate surface;

S5. introducing inert gas into the reaction chamber to purge excess precursor and reaction by-products, with a purge time of 5-50 s;

S6. introducing oxygen source into the reaction chamber in pulse form, with a pulse time of 0.02-50 s and a flow rate of 20-200 sccm, to generate an oxide film;

S7. introducing inert gas into the reaction chamber to purge excess oxygen source and reaction by-products, with a purge time of 5-50 s;

S8. repeating steps S2-S7 for X cycles until a preset thickness is reached, where X is an integer greater than or equal to 1.

Preferably, in step S1, the aspect ratio of the HAR substrate is 30:1.

Preferably, in step S2, the pulse time is 0.02-5 s, and the carrier gas flow rate is 20-200 sccm.

Preferably, in step S4, the pulse time is 0.02-10 s, and the carrier gas flow rate is 20-200 sccm.

Preferably, the precursor is a Si-based precursor or a metal-based precursor.

Preferably, the Si-based precursor is one or more of aminosilanes and halosilanes.

Preferably, the metal-based precursor is one or more of Ti metal-based precursor, Zr metal-based precursor, Hf metal-based precursor, Nb metal-based precursor, Co metal-based precursor, Ni metal-based precursor, V metal-based precursor, Ta metal-based precursor, lanthanide metal-based precursor, Ru metal-based precursor, Pt metal-based precursor, Al metal-based precursor, and Mg metal-based precursor.

Preferably, the aminosilane is one or both of diisopropylaminosilane (DIPAS) and bis(tert-butylamino)silane (BTBAS).

Preferably, the Hf metal-based precursor is one or both of tris(dimethylamino)cyclopentadienyl hafnium and ([CpHf(NMe$_2$)$_3$])tetrakis(ethylmethylamino)hafnium (TEMAHf).

Preferably, the Zr metal-based precursor is one or both of tris(dimethylamino)cyclopentadienyl zirconium ([CpZr(NMe$_2$)$_3$]) and tetrakis(ethylmethylamino)zirconium (TEMAZr).

Preferably, the Ti metal-based precursor is trimethoxy (pentamethylcyclopentadienyl)titanium [Cp*Ti(OMe)$_3$, abbreviated as Star-Ti].

Preferably, the Nb metal-based precursor is one or both of (tert-butylimido)bis(dimethylamino) (cyclopentadienyl)niobium ([CpNb(N$^t$BuN)(NMe$_2$)$_2$]) and tert-butylimido tris(diethylamino)niobium (TBTDEN).

Preferably, the oxygen source in step S6 is one or several of $O_3$, $O_2$, $H_2O$, $H_2O_2$, $O_2$ plasma.

Preferably, the inert gas is one of nitrogen ($N_2$), argon (Ar), helium (He), and krypton (He).

Preferably, the HAR substrate includes but is not limited to inorganic materials such as silicon wafer, glass, metal, or organic materials such as polyethylene terephthalate (PET), polyethylene naphthalate (PEN).

Beneficial Effects of the Application:

The present application proposes three new types of organic small molecule inhibitors with multi-functional group effects, namely urea compounds, amino acid compounds, and amidine compounds. Compared to previously reported inhibitor molecules, these three types of inhibitors have two or more N and O atoms in their molecular structures, which form multiple hydrogen bonds, resulting in better inhibition effects. For example, urea contains the ureido group —N—CO—N—, amino acids contain carboxyl groups-COOH and amino groups —NH$_2$, and amidine compounds contain two active N atoms. These active groups or active atoms form multiple hydrogen bonds with the HAR substrate, occupying more active sites, more effectively inhibiting excessive adsorption of precursors at the top, thereby inhibiting film growth at the top while leaving bottom growth uninhibited or weakly inhibited. This significantly improves step coverage and eliminates the formation of seams or voids during gap filling processes.

DETAILED DESCRIPTION

The following will combine the examples of the present application to provide a clear and complete description of the technical solutions in the examples of the present application. Obviously, the described examples are only a part of the examples of the present application, not all examples. Based on the examples in the present application, all other examples obtained by those skilled in the art without creative work are within the protection scope of the present application.

Example 1

This example provides an application method of organic small molecule inhibitors in thin film deposition, comprising the following steps:
- S1. placing the silicon wafer (with an aspect ratio of 30:1) into the atomic layer deposition equipment, heating the reaction chamber body to 300° C., and evacuating to 5 Pa;
- S2. loading urea into a stainless-steel source bottle, connecting the source bottle to the reaction chamber of the atomic layer deposition equipment through a pipeline, heating the source bottle to room temperature, heating the pipeline to 150° C., using argon as the carrier gas, introducing urea into the reaction chamber in pulse form with a pulse time of 0.08 s and a carrier gas flow rate of 40 sccm;
- S3. introducing argon into the reaction chamber to purge excess urea, with a purge time of 15 s;
- S4. placing tris(dimethylamino)cyclopentadienyl zirconium ([CpZr(NMe$_2$)$_3$]) in a stainless-steel source bottle, connecting the source bottle to the reaction chamber via pipeline, heating the source bottle to 90° C., and heating the pipeline to 150° C., using argon as the carrier gas, introducing tris(dimethylamino)cyclopentadienyl zirconium into the reaction chamber in pulse form, with a pulse time of 4 s and a carrier gas flow rate of 40 sccm;
- S5. introducing argon into the reaction chamber to purge excess tris(dimethylamino)cyclopentadienyl zirconium and reaction by-products, with a purge time of 25 s;
- S6. introducing O$_3$ into the reaction chamber in pulse form, with a pulse time of 0.1 s and a flow rate of 50 sccm, to generate an oxide film;
- S7. introducing argon into the reaction chamber to purge excess O$_3$ and reaction by-products, with a purge time of 15 s;
- S8. repeating steps S2-S7 for 200 cycles.

Example 2

This example provides an application method of organic small molecule inhibitors in thin film deposition, comprising the following steps:
- S1. placing the silicon wafer (with an aspect ratio of 30:1) into the atomic layer deposition equipment, heating the reaction chamber body to 300° C., and evacuating to 5 Pa;
- S2, placing glycine in a stainless-steel source bottle, connecting the source bottle to the reaction chamber of the atomic layer deposition equipment through a pipeline, heating the source bottle to room temperature, heating the pipeline to 150° C., using argon as the carrier gas, introducing glycine into the reaction chamber in pulse form with a pulse time of 0.07 s and a carrier gas flow rate of 40 sccm;
- S3 introducing argon into the reaction chamber to purge excess glycine, with a purge time of 15 s;
- S4. placing tris(dimethylamino)cyclopentadienyl zirconium ([CpZr(NMe$_2$)$_3$]) in a stainless-steel source bottle, connecting the source bottle to the reaction chamber through a pipeline, heating the source bottle to 90° C., heating the pipeline to 150° C., using argon as carrier gas, introducing tris(dimethylamino)cyclopentadienyl zirconium into the reaction chamber in pulse form, with a pulse time of 4 s and carrier gas flow rate of 40 sccm;
- S5. introducing argon into the reaction chamber to purge excess tris(dimethylamino)cyclopentadienyl zirconium and reaction by-products, with a purge time of 25 s;
- S6. introducing O$_3$ into the reaction chamber in pulse form, with a pulse time of 0.1 s and a flow rate of 50 sccm, to generate an oxide film;
- S7. introducing argon into the reaction chamber to purge excess O$_3$ and reaction by-products, with a purge time of 15 s;
- S8. repeat steps S2-S7 for 200 cycles.

Example 3

This example provides an application method of organic small molecule inhibitors in thin film deposition, comprising the following steps:
- S1. placing the silicon wafer (with an aspect ratio of 30:1) into the atomic layer deposition equipment, heating the reaction chamber body to 300° C., and evacuating to 5 Pa;
- S2. placing formamidine in a stainless-steel source bottle, connecting the source bottle to the reaction chamber of the atomic layer deposition equipment through a pipeline, heating the source bottle to room temperature, heating the pipeline to 150° C., using argon as the carrier gas, introducing formamidine into the reaction chamber in pulse form, with a pulse time of 0.05 s and a carrier gas flow rate of 40 sccm;
- S3. introducing helium into the reaction chamber to purge excess formamidine, with a purge time of 15 s;
- S4. placing tris(dimethylamino)cyclopentadienyl zirconium ([CpZr(NMe$_2$)$_3$]) in a stainless-steel source bottle, connecting the source bottle to the reaction chamber through a pipeline, heating the source bottle to 90° C., heating the pipeline to 150° C., using argon as the carrier gas, introducing the tris(dimethylamino)cyclopentadienyl zirconium into the reaction chamber in pulse form, with a pulse time of 4 s and a carrier gas flow rate of 40 sccm;
- S5. introducing argon into the reaction chamber to purge excess tris(dimethylamino)cyclopentadienyl zirconium and reaction by-products, with a purge time of 25 s;
- S6. introducing O$_3$ into the reaction chamber in pulse form, with a pulse time of 0.1 s and a flow rate of 50 sccm, to generate an oxide film;
- S7. introducing argon into the reaction chamber to purge excess O$_3$ and reaction by-products, with a purge time of 15 s;
- S8. repeating steps S2-S7 for 200 cycles.

Example 4

This example provides a method for applying the organic small molecule inhibitors in thin film deposition, comprising the following steps:

S1. placing the silicon wafer (with an aspect ratio of 30:1) into the atomic layer deposition equipment, heating the reaction chamber body to 350° C., and evacuating to 5 Pa;

S2. loading hydroxyethyl urea into a stainless-steel source bottle, connecting the source bottle to the reaction chamber of the atomic layer deposition equipment through a pipeline, heating the source bottle to room temperature, heating the pipeline to 150° C., using argon as the carrier gas, introducing the hydroxyethyl urea into the reaction chamber in pulse form, with a pulse time of 0.3 s and a carrier gas flow rate of 40 sccm;

S3. introducing argon into the reaction chamber to purge excess hydroxyethyl urea, with a purge time of 15 s;

S4. placing tris(dimethylamino)cyclopentadienyl hafnium ([CpHf(NMe$_2$)$_3$]) in a stainless-steel source bottle, connecting the source bottle to the reaction chamber through a pipeline, heating the source bottle to 80° C., heating the pipeline to 150° C., using argon as the carrier gas, introducing tris(dimethylamino)cyclopentadienyl hafnium into the reaction chamber in pulse form, with a pulse time of 0.5 s and a carrier gas flow rate of 40 sccm;

S5. introducing argon into the reaction chamber to purge excess tris(dimethylamino)cyclopentadienyl hafnium and reaction by-products, with a purge time of 25 s;

S6. introducing O$_3$ into the reaction chamber in pulse form, with a pulse time of 5 s and a flow rate of 50 sccm;

S7. introducing argon into the reaction chamber to purge excess O$_3$ and reaction by-products, with a purge time of 15 s;

S8. repeating steps S2-S7 for 200 cycles.

Example 5

This example provides an application method of organic small molecule inhibitors in thin film deposition. Compared with Example 4, "hydroxyethyl urea" in Example 4 is replaced with "alanine," the pulse time of alanine is 0.2 s, and the remaining materials and specific steps are the same as Example 4.

Example 6

This example provides an application method of organic small molecule inhibitors in thin film deposition. Compared with Example 4, "hydroxyethyl urea" in Example 4 is replaced with "N-hydroxyethyl amidine," the pulse time of N-hydroxyethyl amidine is 0.2 s, and the remaining materials and specific steps are the same as Example 4.

Example 7

This example provides an application method of organic small molecule inhibitors in thin film deposition, comprising the following steps:

S1. placing the silicon wafer (with an aspect ratio of 30:1) into the atomic layer deposition equipment, heating the reaction chamber body to 400° C., and evacuating to 5 Pa;

S2. loading aminourea into a stainless-steel source bottle, connecting the source bottle to the reaction chamber of the atomic layer deposition equipment through a pipeline, heating the source bottle to room temperature, heating the pipeline to 150° C., using argon as the carrier gas, introducing aminourea into the reaction chamber in pulse form, with a pulse time of 0.07 s and a carrier gas flow rate of 100 sccm;

S3. introducing argon into the reaction chamber to purge excess aminourea, with a purge time of 15 s;

S4. placing trimethoxy(pentamethylcyclopentadienyl)titanium ([Cp*Ti(OMe)$_3$]), abbreviated as Star-Ti, in a stainless-steel source bottle, connecting the source bottle to the reaction chamber through a pipeline, heating the source bottle to 90° C., heating the pipeline to 150° C., using argon as the carrier gas, introduce trimethoxy(pentamethylcyclopentadienyl)titanium into the reaction chamber in pulse form, with a pulse time of 0.15 s and a carrier gas flow rate of 100 sccm;

S5. introducing inert gas into the reaction chamber to purge excess trimethoxy(pentamethylcyclopentadienyl)titanium and reaction by-products, with a purge time of 30 s;

S6. introducing O$_3$ into the reaction chamber in pulse form, with a pulse time of 5 s and a flow rate of 50 sccm, to generate an oxide film;

S7. introducing argon into the reaction chamber to purge excess O$_3$ and reaction by-products, with a purge time of 20 s;

S8. repeating steps S2-S7 for 200 cycles.

Example 8

This example provides an application method of organic small molecule inhibitors in thin film deposition. Compared with Example 7, "aminourea" in Example 7 is replaced with "isoleucine". The source bottle heating temperature for isoleucine is 30° C., with a pulse time of 0.2 s. The remaining materials and specific steps are the same as in Example 7.

Example 9

This example provides an application method of organic small molecule inhibitors in thin film deposition. Compared with Example 7, "aminourea" in Example 7 is replaced with "propionamidine," with propionamidine pulse time of 0.3 s, and the remaining materials and specific steps are the same as Example 7.

Comparative Example 1

This comparative example provides an application method of organic small molecule inhibitors in thin film deposition. Compared with Example 1, steps S2 and S3 in Example 1 are removed, and the remaining materials and specific steps are the same as Example 1.

Comparative Example 2

This comparative example provides an application method of organic small molecule inhibitors in thin film deposition. Compared with Example 4, steps S2 and S3 in Example 4 are removed, and the remaining materials and specific steps are the same as Example 4.

Comparative Example 3

This comparative example provides an application method of organic small molecule inhibitors in thin film deposition. Compared with Example 7, steps S2 and S3 in Example 7 are removed, and the remaining materials and specific steps are the same as Example 7.

Comparative Example 4

This example provides an application method of organic small molecule inhibitors in thin film deposition. Compared with Example 1, the "urea" in Example 1 is replaced with "triethylamine", the pulse time of triethylamine is 0.2 s, the remaining materials and specific steps are the same as Example 1.

Comparative Example 5

This example provides an application method of organic small molecule inhibitors in thin film deposition. Compared with Example 4, "hydroxyethyl urea" in Example 4 is replaced with "ethylene glycol dimethyl ether", the pulse time of ethylene glycol dimethyl ether is 0.2 s, the remaining materials and specific steps are the same as Example 4.

Comparative Example 6

This example provides an application method of organic small molecule inhibitors in thin film deposition. Compared with Example 7, "aminourea" in Example 7 is replaced with "tetrahydrofuran," the pulse time of tetrahydrofuran is 0.02 s, the remaining materials and specific steps are the same as Example 7.

The deposited films obtained from Examples 1-9 and Comparative Examples 1-6 were examined, with film thicknesses at the top and bottom of the HAR substrate measured by transmission electron microscopy, and the step coverage was subsequently calculated. The instrument model used was Talos F200X;

The step coverage calculation method is as follows:

$$\text{Step coverage} = \frac{\text{film thickness at the bottom}}{\text{film thickness at the top}} \times 100\%$$

The test results are shown in Table 1:

TABLE 1

| | precursor | Inhibitor | Oxidant | step coverage |
|---|---|---|---|---|
| Example 1 | $CpZr(NMe_2)_3$ | urea | $O_3$ | 100.1% |
| Example 2 | $CpZr(NMe_2)_3$ | Glycine | $O_3$ | 99.5% |
| Example 3 | $CpZr(NMe_2)_3$ | Methanediamine | $O_3$ | 98.7% |
| Example 4 | $CpHf(NMe_2)_3$ | hydroxyethyl urea | $O_3$ | 98.8% |
| Example 5 | $CpHfNMe_2)_3$ | alanine | $O_3$ | 98.2% |
| Example 6 | $CpHfNMe_2)_3$ | N-hydroxyethylamidine | $O_3$ | 100.4% |
| Example 7 | Star-Ti | aminourea | $O_3$ | 100.0% |
| Example 8 | Star-Ti | isoleucine | $O_3$ | 98.7% |
| Example 9 | Star-Ti | Propylamidine | $O_3$ | 99.4% |
| Comparative Example 1 | $CpZr(NMe_2)_3$ | No inhibitor | $O_3$ | 90.6% |
| Comparative Example 2 | $CpHfNMe_2)_3$ | No inhibitor | $O_3$ | 91.4% |
| Comparative Example 3 | Star-Ti | No inhibitor | $O_3$ | 90.2% |
| Comparative Example 4 | $CpZr(NMe_2)_3$ | triethylamine | $O_3$ | 93.5% |
| Comparative Example 5 | $CpHfNMe_2)_3$ | ethylene glycol dimethyl ether | $O_3$ | 93.7% |
| Comparative Example 6 | Star-Ti | tetrahydrofuran | $O_3$ | 94.1% |

As shown in the data recorded in Table 1, compared to Comparative Examples 1-3 without inhibitors and Comparative Examples 4-6 using small molecule inhibitors (triethylamine, ethylene glycol dimethyl ether, tetrahydrofuran), Examples 1-9 using small molecule inhibitors achieved higher step coverage with better results. This proves that compared to previously reported inhibitor molecules, the inhibitor molecules in the present application have two or more N and O atoms in their molecular structure, which form multiple hydrogen bonds, providing better inhibition effects. They inhibit the growth of the top film layer while the bottom growth remains uninhibited or only weakly inhibited, significantly improving step coverage and eliminating the formation of seams or voids during gap filling processes.

It should be noted that in this document, relational terms such as "first" and "second" are used solely to distinguish one entity or operation from another entity or operation, and do not necessarily require or imply any actual relationship or sequence between these entities or operations. Moreover, the terms "include," "comprise," or any other variants thereof are intended to cover non-exclusive inclusion, such that a process, method, article, or device that includes a series of elements not only includes those elements but also includes other elements not explicitly listed, or elements inherent to such process, method, article, or device.

Although examples of the present application have been shown and described, it will be understood by those skilled in the art that various changes, modifications, substitutions, and variations can be made to these examples without departing from the principles and spirit of the present application. The scope of the present application is defined by the appended claims and their equivalents.

What is claimed is:

1. An application method of the organic small molecule inhibitors in thin film deposition, characterized in that comprising the following steps:
   S1. placing a HAR substrate into an atomic layer deposition equipment, with chamber temperature of 100-450° C., and evacuating to 0-30 Pa;
   S2. loading the organic small molecule inhibitors into a stainless-steel source bottle connected to a reaction chamber, heating the source bottle to 30-100° C., heating a pipeline to 50-150° C., using inert gas as carrier gas, and introducing the organic small molecule inhibitors into the reaction chamber in pulse form;
   S3. introducing inert gas into the reaction chamber, with a purge time of 5-50 s;
   S4. placing a precursor in the stainless-steel source bottle, connecting the source bottle to the reaction chamber through a pipeline, heating the source bottle to a temperature of 30-100° C., heating the pipeline to a temperature of 50-150° C., using inert gas as a carrier gas, and introducing the precursor into the reaction chamber in pulse form;
   S5. introducing inert gas into the reaction chamber, with a purge time of 5-50 s;
   S6. introducing oxygen source into the reaction chamber in pulse form, with a pulse time of 0.02-50 s and a flow rate of 20-200 sccm;
   S7. introducing inert gas into the reaction chamber, with a purging time of 5-50 s;
   S8. repeating steps S2-S7 for X cycles until a preset thickness is reached, where X is an integer greater than or equal to 1;

the organic small molecule inhibitor comprises urea compounds, amino acid compounds and amidine compounds;

the urea compound is one of urea, hydroxyethyl urea and aminourea;

the amino acid compound is one of glycine, alanine, and isoleucine;

the amidine compound is one of N,N'-diisopropyl-formamidine, N,N'-diisopropyl-acetamidine, N,N'-diisopropyl-propionamidine, N-hydroxyacetamidine, formamidine, acetamidine, and propionamidine.

2. The application method of organic small molecule inhibitors in thin film deposition according to claim 1, characterized in that the precursor is a Si-based precursor or a metal-based precursor.

* * * * *